United States Patent
Qian

(10) Patent No.: US 11,264,497 B2
(45) Date of Patent: Mar. 1, 2022

(54) LDMOS DEVICE AND METHOD FOR MANUFACTURING SAME

(71) Applicant: SHANGHAI HUAHONG GRACE SEMICONDUCTOR MANUFACTURING CORPORATION, Shanghai (CN)

(72) Inventor: Wensheng Qian, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 78 days.

(21) Appl. No.: 16/657,096

(22) Filed: Oct. 18, 2019

(65) Prior Publication Data

US 2020/0235237 A1 Jul. 23, 2020

(30) Foreign Application Priority Data

Jan. 22, 2019 (CN) .......................... 201910056315.0

(51) Int. Cl.
*H01L 29/78* (2006.01)
*H01L 29/10* (2006.01)
(Continued)

(52) U.S. Cl.
CPC .... *H01L 29/7816* (2013.01); *H01L 21/26513* (2013.01); *H01L 21/26586* (2013.01);
(Continued)

(58) Field of Classification Search
CPC ............. H01L 29/7816; H01L 29/1083; H01L 29/1095; H01L 29/408; H01L 29/66537;
(Continued)

(56) References Cited

U.S. PATENT DOCUMENTS

| | | | |
|---|---|---|---|
| 5,492,847 A | 2/1996 | Kao et al. | |
| 8,507,988 B2 | 8/2013 | Yao et al. | |
| 2008/0237703 A1* | 10/2008 | Lin | ................... H01L 29/66689 257/336 |
| 2010/0244106 A1 | 9/2010 | Parker et al. | |

(Continued)

FOREIGN PATENT DOCUMENTS

CN 10202174 A 6/2011

OTHER PUBLICATIONS

Search Report issued in corresponding Chinese Patent Application No. 2019100563150, dated Aug. 2, 2021.

*Primary Examiner* — Christine A Enad
(74) *Attorney, Agent, or Firm* — MKG, LLC

(57) ABSTRACT

Disclosed is an LDMOS device comprising a drift region formed by a selected area of a doped layer of a first conductivity type on a semiconductor substrate, a gate structure comprising a gate dielectric layer and a gate conductive layer which are sequentially formed on a surface of the doped layer of the first conductivity type, a doped self-aligned channel region of a second conductivity type, and a doped layer formed by tilted ion implantation with a first side face of the gate structure as a self-alignment condition. A method for manufacturing an LDMOS device is further disclosed. The channel length is not affected by lithography and thus can be minimized to fulfill an ultralow specific-on-resistance, and the distribution uniformity of the channel length can be improved, so that the performance uniformity of the device is improved.

6 Claims, 3 Drawing Sheets

(51) Int. Cl.
  *H01L 29/40*  (2006.01)
  *H01L 29/66*  (2006.01)
  *H01L 21/265*  (2006.01)
  *H01L 21/324*  (2006.01)

(52) U.S. Cl.
  CPC ........ *H01L 21/324* (2013.01); *H01L 29/1083* (2013.01); *H01L 29/1095* (2013.01); *H01L 29/408* (2013.01); *H01L 29/6659* (2013.01); *H01L 29/66537* (2013.01); *H01L 29/66681* (2013.01); *H01L 29/7835* (2013.01)

(58) Field of Classification Search
  CPC ........... H01L 29/6659; H01L 29/66681; H01L 21/26513; H01L 21/26586; H01L 21/324
  See application file for complete search history.

(56) References Cited

U.S. PATENT DOCUMENTS

| | | | | |
|---|---|---|---|---|
| 2011/0292964 | A1* | 12/2011 | Kashyap | G01R 31/2874 374/101 |
| 2012/0205738 | A1* | 8/2012 | Yang | H01L 29/7801 257/335 |
| 2013/0181287 | A1* | 7/2013 | Zhang | H01L 21/28211 257/335 |
| 2014/0284701 | A1* | 9/2014 | Korec | H01L 29/872 257/328 |
| 2016/0035884 | A1* | 2/2016 | Fang | H01L 21/26513 257/343 |
| 2020/0144414 | A1* | 5/2020 | Zhang | H01L 29/404 |
| 2020/0220005 | A1* | 7/2020 | Huang | H01L 29/0692 |

* cited by examiner ns on the drift region of the LDMOS devices. For this reason, a well doped region, an anti-punch-through doped region or a threshold voltage adjustment doped region of the devices has to be defined outside the drift region of the devices by lithography and is then formed by implantation. Lithography of these doped regions and lithography of gate structures such as polysilicon gates have a decisive influence on the actual length of a channel formed below the polysilicon gates, wherein the channel is an inversion layer formed on the surface, covered by the polysilicon gates, of a channel region by applying a gate voltage greater than the threshold voltage to the polysilicon gates. The alignment precision of the two times of lithography with respect to an active region determines the control precision of the channel length.

LDMOS DEVICE AND METHOD FOR MANUFACTURING SAME

CROSS REFERENCE TO RELATED APPLICATION

The present application claims priority to Chinese Patent Application No. 201910056315.0 filed on Jan. 22, 2019, the entirety of which is incorporated by reference herein.

TECHNICAL FIELD

The invention relates to the field of semiconductor integrated circuit manufacturing, in particular to a lateral double-diffused metal oxide semiconductor (LDMOS) device and a method for manufacturing the LDMOS device.

BACKGROUND OF THE INVENTION

Low specific-on-resistance is the main objective sought by switch LDMOS devices, and lower specific-on-resistance can greatly reduce the switch power of the switch LDMOS devices. The specific-on-resistance and breakdown voltage are two mutually-constrained parameters of devices. In the prior art, the following methods are adopted to reduce the specific-on-resistance without changing the breakdown voltage:

(1) RESURF (Reduced Surface Field) design is used to make the electric field distribution of the drift region of the LDMOS devices uniform, so that the doping concentration of the drift region can be appropriately increased.

(2) The dimensions, including the length of the drift region and the channel length, of the devices are minimized. Due to the fact that the on-channel resistance accounts for a large proportion of the specific-on-resistance of the devices under a medium applied voltage such as a voltage below 30V, the specific-on-resistance of the devices can be effectively reduced by decreasing the channel length.

For different CMOS devices, well doping cannot be conducted in the drift region of the LDMOS devices. For this reason, a well doped region, an anti-punch-through doped region or a threshold voltage adjustment doped region of the devices has to be defined outside the drift region of the devices by lithography and is then formed by implantation. Lithography of these doped regions and lithography of gate structures such as polysilicon gates have a decisive influence on the actual length of a channel formed below the polysilicon gates, wherein the channel is an inversion layer formed on the surface, covered by the polysilicon gates, of a channel region by applying a gate voltage greater than the threshold voltage to the polysilicon gates. The alignment precision of the two times of lithography with respect to an active region determines the control precision of the channel length.

LDMOS devices with an ultralow specific-on-resistance require for an ultra-small channel length. Alignment errors generated in the two times of lithography may lead to great changes to the characteristics of the devices, such as breakdown voltage drops, electric leakage and specific-on-resistance increase.

The defects of the prior art are illustrated below with reference to FIG. 1A. FIG. 1A is a structural view of an existing LDMOS device. As shown in FIG. 1A, the existing LDMOS device comprises:

A drift region 102, wherein the drift region 102 is formed by a selected area of a doped layer 102 of a first conductivity type, and the doped layer 102 of the first conductivity type 102 is formed on a semiconductor substrate 101;

Generally, the semiconductor substrate 101 is a silicon substrate; the drift region 102 cannot be formed by well doping; the doped layer 102 of the first conductivity type is a full ion implantation layer formed on a surface of the semiconductor substrate 101 or an epitaxial layer of the first conductivity type formed on the surface of the semiconductor substrate 101, and extends onto the surface of the whole semiconductor substrate 101; the whole doped layer 102 of the first conductivity type in FIG. 1A serves as the drift region 102, and thus, both the doped layer of the first conductivity type and the drift region are represented by reference sign 102.

A gate structure, wherein the gate structure comprises a gate dielectric layer 105 and a gate conductive layer 106 which are sequentially formed on a surface of the doped layer 102 of the first conductivity type, and the gate structure has a first side face and a second side face which are defined by lithography. Generally, the gate conductive layer 106 is a polysilicon gate, and the gate dielectric layer 105 is a gate oxide.

The LDMOS device further comprises a well 103 of a second conductivity type, wherein the well 103 of the second conductivity type is formed in the doped layer 102 of the first conductivity type by lithography and ion implantation, and a second side face of the well 103 of the second conductivity type makes contact with a corresponding first side face of the drift region 102.

According to the existing methods, a channel region is directly formed by the well 103 of the second conductivity type, and a channel is formed in a surface, covered by the gate structure, of the well 103 of the second conductivity type.

A drift region field oxide 104 is formed in the drift region 102, and the second side face of the gate structure extends onto a surface of the drift region field oxide 104.

The LDMOS device further comprises a heavily-doped source region 107 of the first conductivity type and a heavily-doped drain region 108 of the first conductivity type.

The source region 107 is formed in a top area of the well 103 of the second conductivity type and is self-aligned to the first side face of the gate structure.

The drain region 108 is formed in the drift region 102 outside a second side of the drift region field oxide 104.

A heavily-doped channel lead-out region 109 of the second conductivity type is formed in the top area of the well 103 of the second conductivity type outside a first side face of the source region 107.

The LDMOS device in FIG. 1 is an N-type LDMOS device or a P-type LDMOS device. If the LDMOS device is an N-type LDMOS device, the first conductivity type is an N type, and the second conductivity type is a P type. In other embodiments, the LDMOS device is a P-type LDMOS device, the first conductivity type is a P type, and the second conductivity type is an N type.

As can be seen from FIG. 1, due to the fact that the channel is formed in the surface, covered by the gate structure, of the well 103 of the second conductivity type, the actual channel length $Lc101a$ is defined by lithography of the well 103 of the second conductivity type as well as lithography of the gate structure, which will result in the following drawbacks:

First, the decrease of the channel length Lc101a is restricted by the two times of lithography definition, which in turn restricts the decrease of the specific-on-resistance of the device.

Second, alignment errors may be caused during alignment conducted between the two times of lithography and can lead to channel length deviations. For instance, the channel lengths in different regions of the same semiconductor substrates 102 may be different. As shown in FIG. 1B, the channel length Lc101b is different from the channel length Lc101a. Similarly, the channel lengths obtained by the same process on different semiconductor substrates 101 may also be different. As a result, the channel lengths of the device is non-uniform, and great changes to the characteristics of the devices, such as breakdown voltage drops, electric leakage and specific-on-resistance increase, are caused.

BRIEF SUMMARY OF THE INVENTION

The technical issue to be settled by the invention is to minimize the channel length and to realize an ultralow specific-on-resistance by providing an LDMOS device. Correspondingly, the invention further provides a method for manufacturing an LDMOS device.

To settle the above technical issue, the invention provides an LDMOS device. The LDMOS device comprises:

a drift region, wherein the drift region is formed by a selected area of a doped layer of a first conductivity type, and the doped layer of the first conductivity type is formed on a semiconductor substrate;

a gate structure, wherein the gate structure comprises a gate dielectric layer and a gate conductive layer which are sequentially formed on a surface of the doped layer of the first conductivity type, and the gate structure has a first side face and a second side face which are defined by lithography; and a doped self-aligned channel region of a second conductivity type, wherein the self-aligned channel region is formed on a surface of the doped layer of the first conductivity type at an inner bottom of the first side face of the gate structure and is a doped region formed by tilted ion implantation with the first side face of the gate structure as a self-alignment condition, a channel is formed in a surface, covered by the gate structure, of the self-aligned channel region, and the length of the channel is defined by self-alignment of the tilted ion implantation and is not affected by lithography.

Furthermore, the LDMOS device further comprises a well of a second conductivity type, wherein the well of the second conductivity type is formed in the doped layer of the first conductivity type and defined by lithography, and a second side face of the well of the second conductivity type makes contact with a corresponding first side face of the drift region.

A bottom surface of the self-aligned channel region extends into the well of the second conductivity type.

Furthermore, an anti-punch-through (APT) ion implantation region is formed in a surface area of the well of the second conductivity type.

Furthermore, the LDMOS device further comprises a source side lightly-doped drain (LDD) of the first conductivity type, wherein the source side lightly-doped drain is formed in a top area of the well of the second conductivity type and is self-aligned to the first side face of the gate structure, a bottom surface of the source side lightly-doped drain extends into the well of the second conductivity type, and a second side face of the source side lightly-doped drain makes contact with a first side face of the self-aligned channel region.

Furthermore, a drift region field oxide is formed in the drift region, and the second side face of the gate structure extends onto a surface of the drift region field oxide.

Spacers are formed on the first side face and the second side face of the gate structure.

The LDMOS device further comprises a heavily-doped source region of the first conductivity type and a heavily-doped drain region of the first conductivity type.

The source region is formed in the top area of the well of the second conductivity type and is self-aligned to the first side face of the gate structure, a bottom surface of the source region extends into the well of the second conductivity type, and a second side face of the source region makes contact with a first side face of the source side lightly-doped drain.

The drain region is formed in the drift region outside a second side of the drift region field oxide.

Furthermore, a heavily-doped channel lead-out region of the second conductivity type is formed in the top area of the well of the second conductivity type outside a first side face of the source region.

Furthermore, the tilted ion implantation of the self-aligned channel region is pocket ion implantation.

Furthermore, the semiconductor substrate is a silicon substrate, and the gate conductive layer is a polysilicon gate.

The doped layer of the first conductivity type is a full ion implantation layer formed on a surface of the semiconductor substrate, or the doped layer of the first conductivity type is an epitaxial layer of the first conductivity type formed on the surface of the semiconductor substrate.

To settle the above technical issue, the invention further provides a method for manufacturing an LDMOS device. The method comprises the following steps:

Step 1, forming a doped layer of a first conductivity type on a semiconductor substrate, and forming a drift region by a selected area of the doped layer of the first conductivity type;

Step 2, forming a gate structure through the following sub-steps:

Step 21, forming a gate dielectric layer and a gate conductive layer on a surface of the doped layer of the first conductivity type;

Step 22, defining a formation area of the gate structure by lithography, and sequentially etching the gate conductive layer and the gate dielectric layer to form the gate structure, wherein the gate structure has a first side face and a second side face which are defined by lithography; and Step 3, forming a doped self-aligned channel region of a second conductivity type on the surface of the doped layer of the first conductivity type at an inner bottom of the first side face of the gate structure by tilted ion implantation with the first side face of the gate structure as a self-alignment condition, and forming a channel in a surface, covered by the gate structure, of the self-aligned channel region, wherein the length of the channel is defined by self-alignment of the tilted ion implantation and is not affected by lithography.

Furthermore, before the gate structure is formed, the method further comprises the step of forming a well of the second conductivity type through the following sub-steps:

defining a formation area of the well of the second conductivity type by lithography; and conducting ion implantation of the second conductivity type and thermal annealing to form the well of the second conductivity type in a selected area of the doped layer of the first conductivity type, wherein a second side face of the well of the second conductivity type makes contact with a corresponding first side face of the drift region.

A bottom surface of the self-aligned channel region extends into the well of the second conductivity type.

Furthermore, after the well of the second conductivity type is formed, the method further comprises the following steps: conducting APT ion implantation to form an APT ion implantation region on a surface area of the well of the second conductivity type; and forming a drift region field oxide in the drift region, wherein the second side face of the gate structure extends onto a surface of the drift region field oxide.

Furthermore, the method further comprises the following steps to be executed after Step 3:

Step 4, conducting lightly-doped ion implantation of the first conductivity type to form a source side lightly-doped drain, wherein the source side lightly-doped drain is formed in the top area of the well of the second conductivity type and is self-aligned to the first side face of the gate structure, a bottom surface of the source side lightly-doped drain extends into the well of the second conductivity type, and a second side face of the source side lightly-doped drain makes contact with a first side face of the self-aligned channel region;

Step 5, forming spacers on the first side face and the second side face of the gate structure; and Step 6, conducting heavily-doped source-drain implantation of the first conductivity type to form a source region and a drain region, wherein the source region is formed in the top area of the well of the second conductivity type and is self-aligned to the spacer on the first side face of the gate structure, a bottom surface of the source region extends into the well of the second conductivity type, and a second side face of the source region makes contact with a first side face of the source side lightly-doped drain.

The drain region is formed in the drift region outside a second side of the drift region field oxide.

Furthermore, the method further comprises the following step:

Step 7, conducting heavily-doped ion implantation of the second conductivity type to form a channel lead-out region in the top area of the well of the second conductivity type outside a first side face of the source region.

Furthermore, the tilted ion implantation of the self-aligned channel is pocket ion implantation.

Furthermore, the semiconductor substrate is a silicon substrate, and the gate conductive layer is a polysilicon gate. In Step 1, the doped layer of the first conductivity type is formed by full ion implantation conducted on a surface of the semiconductor substrate; or, the doped layer of the first conductivity type is an epitaxial layer of the first conductivity type formed on the surface of the semiconductor substrate.

In the invention, the self-aligned channel region which is self-aligned to the first side face of the gate structure is used as a channel region and is formed by tilted ion implantation with the first side face of the gate structure as the self-alignment condition, the self-aligned channel region formed by tilted ion implantation can extend onto the surface of the doped layer of the first conductivity type at the inner bottom of the first side face of the gate structure, the channel is formed in the surface, covered by the gate structure, of the self-aligned channel region, in this way, the length of the channel in this embodiment is completely defined by self-alignment of the tilted ion implantation and is not affected by lithography. In the invention, lithography have the following two influences:

First, in the prior art, the actual length of the channel is determined completely by the two times of lithography such as lithography of the well region and lithography of the polysilicon gate; while in this embodiment, the length of the channel is not defined by lithography, so that the length of the channel can be minimized to fulfill an ultralow specific-on-resistance.

Second, in the prior art, multiple LDMOS devices are integrated on one semiconductor substrate, the actual lengths of channels in these LDMOS devices are different, and the length deviation is determined by the alignment precision of the two times of lithography relative to an active region, so that the actual channel lengths in different regions are different in the prior art, that is to say, the length accuracy of the channels cannot be effectively controlled; while in this embodiment, the channel length is independent of the alignment precision of lithography, so that the distribution uniformity of the channel length is improved, that is to say, the length accuracy of the channel can be effectively controlled, and thus, the performance uniformity of the device is improved.

In addition, because the length accuracy of the channel is improved while the length of the channel is decreased in this embodiment, negative influences on the performance of the device caused by deterioration of the length uniformity of the channel are avoided when the length of the channel is decreased in the prior art. In this embodiment, the breakdown voltage of the device is maintained or improved, and electric leakage of the device is maintained or reduced.

BRIEF DESCRIPTION OF THE DRAWINGS

The invention is further expounded below with reference to accompanying drawings and specific embodiments.

DETAILED DESCRIPTION OF PREFERRED EMBODIMENTS OF THE INVENTION

Figure 1A:
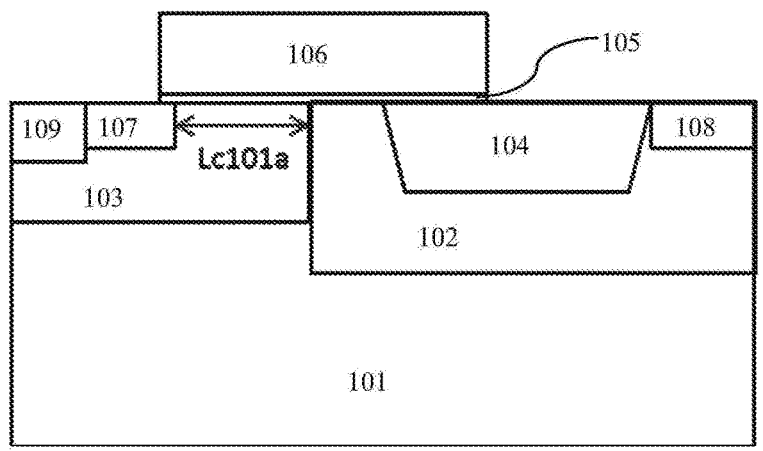
FIG. 1A is a structural view of an existing LDMOS device.
Figure 1B:
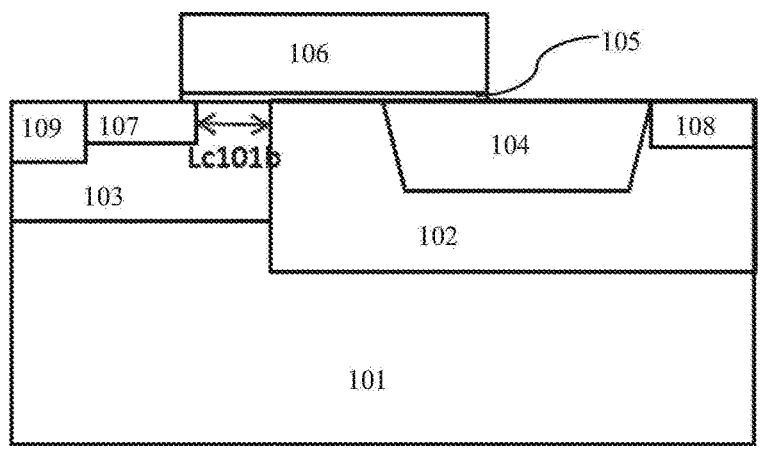
FIG. 1B is a structural view of the existing LDMOS device having a different channel length relative to FIG. 1A.
Figure 2:
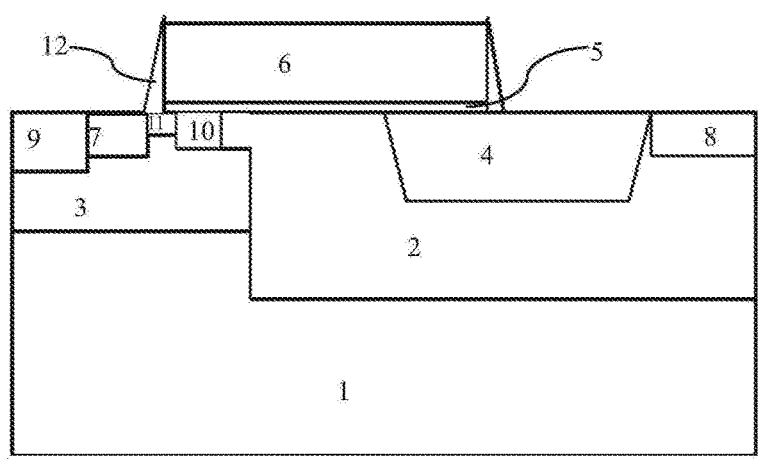
FIG. 2 is a structural view of an LDMOS device in an embodiment of the invention.

FIG. 2 is a structural view of an LDMOS device in an embodiment of the invention. As shown in FIG. 2, the LDMOS device in this embodiment comprises:

A drift region 2, wherein the drift region 2 is formed by a selected area of a doped layer 2 of a first conductivity type, and the doped layer 2 of the first conductivity type is formed on a semiconductor substrate 1.

In this embodiment, the semiconductor substrate 1 is a silicon substrate. The doped layer 2 of the first conductivity type is a full ion implantation layer formed on a surface of the semiconductor substrate 1, that is to say, the doped layer 2 of the first conductivity type extends onto the surface of the whole semiconductor substrate 1. The whole doped layer 2 of the first conductivity type in FIG. 2 serves as the drift region 2, and thus, both the doped layer of the first conductivity type and the drift region are represented by reference sign 2. Or, in other embodiments, the doped layer 2 of the first conductivity type is an epitaxial layer of the first conductivity type formed on the surface of the semiconductor substrate 1.

A gate structure, wherein the gate structure comprises a gate dielectric layer 5 and a gate conductive layer 6 which are sequentially formed on a surface of the doped layer 2 of the first conductivity type, and the gate structure has a first side face and a second side face which are defined by lithography. In this embodiment, the gate conductive layer 6 is a polysilicon gate, and the gate dielectric layer 5 is a gate oxide.

A doped self-aligned channel region 10 of a second conductivity type, wherein self-aligned channel region 10 is formed on the surface of the doped layer 2 of the first conductivity type at an inner bottom of the first side face of the gate structure and is a doped region formed by tilted ion implantation with the first side face of the gate structure as a self-alignment condition; a channel is formed in a surface, covered by the gate structure, of the self-aligned channel region 10, and the length of the channel is defined by self-alignment of the tilted ion implantation without being affected by lithography. Preferably, the tilted ion implantation of the self-aligned channel region 10 is pocket ion implantation.

The LDMOS device further comprises a well 3 of the second conductivity type, wherein the well 3 of the second conductivity type is formed in the doped layer 2 of the first conductivity type and defined by lithography and has a second side face in contact with a corresponding first side face of the drift region 2.

A bottom surface of the self-aligned channel region 10 extends into the well 3 of the second conductivity type.

An anti-punch-through ion implantation region is formed in a surface area of the well 3 of the second conductivity type.

The LDMOS device further comprises a source side lightly-doped drain 11 of the first conductivity type, wherein the source side lightly-doped drain 11 of the first conductivity type is formed in a top area of the well 3 of the second conductivity type and is self-aligned to the first side face of the gate structure, a bottom surface of the source side lightly-doped drain 11 extends into the well 3 of the second conductivity type, and a second side face of the source side lightly-doped drain 11 makes contact with a first side face of the self-aligned channel region 10.

A drift region field oxide 4 is formed in the drift region 2, and the second side face of the gate structure extends onto a surface of the drift region field oxide 4.

Spacers 12 are formed on the first side face and the second side face of the gate structure.

The LDMOS device further comprises a heavily-doped source region 7 of the first conductivity type and a heavily-doped drain region 8 of the first conductivity type.

The source region 7 is formed in the top area of the well 3 of the second conductivity type and is self-aligned to the spacer 12 on the first side face of the gate structure, a bottom surface of the source region 7 extends into the well 3 of the second conductivity type, and a second side face of the source region 7 makes contact with a first side face of the source side lightly-doped drain 11.

The drain region 8 is formed in the drift region 2 outside a second side of the drift region field oxide 4.

A heavily-doped channel lead-out region 9 of the second conductivity type is formed in the top area of the well 3 of the second conductivity type outside a first side face of the source region 7.

In this embodiment, the LDMOS device is an N-type LDMOS device, the first conductivity type is an N type, and the second conductivity type is a P type. Or, in other embodiments, the LDMOS device is a P-type LDMOS device, the first conductivity type is a P type, and the second conductivity type is an N type.

In this embodiment of the invention, the self-aligned channel region 10 which is self-aligned to the first side face of the gate structure is used as a channel region and is formed by tilted ion implantation with the first side face of the gate structure as the self-alignment condition, the self-aligned channel region 10 formed by tilted ion implantation can extend onto the surface of the doped layer 2 of the first conductivity type at the inner bottom of the first side face of the gate structure, the channel is formed in the surface, covered by the gate structure, of the self-aligned channel region 10, in this way, the length of the channel in this embodiment is completely defined by self-alignment of the tilted ion implantation and is not affected by lithography. In this embodiment, lithography have the following two influences:

First, in the prior art, the actual length of the channel is determined completely by the two times of lithography such as lithography of the well region and lithography of the polysilicon gate; while in this embodiment, the length of the channel is not defined by lithography, so that the length of the channel can be minimized to fulfill an ultralow specific-on-resistance.

Second, in the prior art, multiple LDMOS devices are integrated on one semiconductor substrate 1, the actual lengths of channels in these LDMOS devices are different, and the length deviation is determined by the alignment precision of the two times of lithography relative to an active region 7, so that the actual channel lengths in different regions are different in the prior art, that is to say, the length accuracy of the channels cannot be effectively controlled; while in this embodiment, the channel length is independent of the alignment precision of lithography, so that the distribution uniformity of the channel length is improved, that is to say, the length accuracy of the channel can be effectively controlled, and thus, the performance uniformity of the device is improved.

In addition, because the length accuracy of the channel is improved while the length of the channel is decreased in this embodiment, negative influences on the performance of the device caused by deterioration of the length uniformity of the channel are avoided when the length of the channel is decreased in the prior art. In this embodiment, the breakdown voltage of the device is maintained or improved, and electric leakage of the device is maintained or reduced.

Figure 3A:
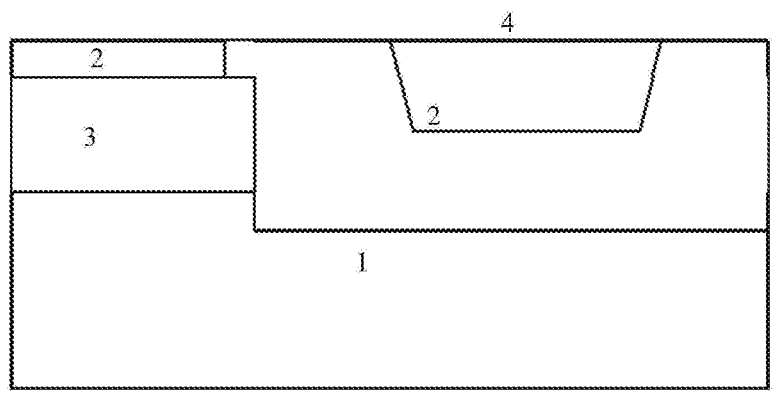
FIGS. 3A-3E are structural views of the device in all steps of a method in an embodiment of the invention.

FIGS. 3A-3E are structural views of the device in all steps of a method in an embodiment of the invention. As shown in FIGS. 3A-3E, the method for manufacturing an LDMOS device in this embodiment comprises the following steps:

Step 1, as shown in FIG. 3A, a doped layer 2 of a first conductivity type is formed on a semiconductor substrate 1, and a drift region 2 is formed by a selected area of the doped layer 2 of the first conductivity type.

In this embodiment, the semiconductor substrate 1 is a silicon substrate.

The doped layer 2 of the first conductivity type is formed by full ion implantation conducted on a surface of the semiconductor substrate 1. Or, in other embodiments, the doped layer 2 of the first conductivity type is an epitaxial layer of the first conductivity type formed on the surface of the semiconductor substrate 1 by an epitaxy process.

Before a gate structure is formed, the method further comprises the step of forming a well 3 of a second conductivity type through the following sub-steps:

A formation area of the well 3 of the second conductivity type is defined by lithography;

Ion implantation of the second conductivity type and thermal annealing are conducted to form the well 3 of the second conductivity type in a selected area of the doped layer 2 of the first conductivity type, wherein a second side face of the well 3 of the second conductivity type makes contact with a first side face of the drift region 2.

After the well 3 of the second conductivity type is formed, the method further comprises the step of conducting anti-punch-through ion implantation to form an anti-punch-through ion implantation region in a surface area of the well 3 of the second conductivity type.

Then, a drift region field oxide 4 is formed in the drift region 2, wherein a second side face of the gate structure extends onto a surface of the drift region field oxide 4.

Figure 3B:
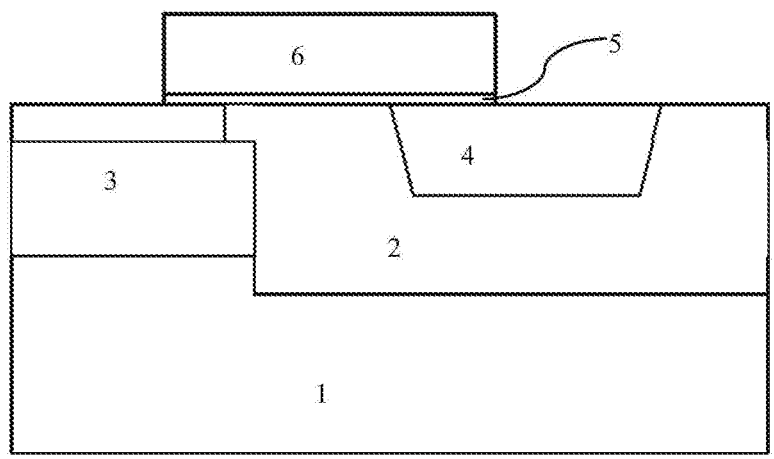

Step 2, as shown in FIG. 3B, the gate structure is formed through the following sub-steps:

Step 21, a gate dielectric layer 5 and a gate conductive layer 6 are formed on a surface of the doped layer 2 of the first conductivity type. In this embodiment, the gate conductive layer 6 is a polysilicon gate formed by polysilicon deposition, and the gate dielectric layer 5 is a gate oxide usually formed by thermal oxidization.

Step 22, a formation area of the gate structure is defined by lithography, and the gate conductive layer 6 and the gate dielectric layer 5 are sequentially etched to form the gate structure, wherein the structure has a first side face and a second side face which are defined by lithography.

Figure 3C:
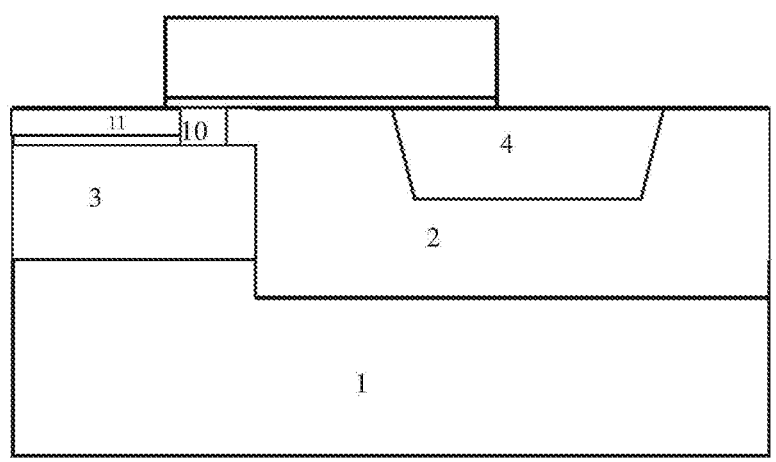

Step 3, as shown in FIG. 3C, a doped self-aligned channel region 10 of the second conductivity type is formed on the surface of the doped layer 2 of the first conductivity type at an inner bottom of the first side face of the gate structure by tilted ion implantation with the first side face of the gate structure as a self-alignment condition, and a channel is formed in a surface, covered by the gate structure, of the self-aligned channel region 10, wherein the length of the channel is defined by self-alignment of the tilted ion implantation and is not affected by lithography.

A bottom surface of the self-aligned channel region 10 extends into the well 3 of the second conductivity type.

In this embodiment, the tilted ion implantation of the self-aligned channel region 10 is pocket ion implantation.

The method further comprises the following steps to be executed after Step 3:

Step 4, as shown in FIG. 3C, lightly-doped ion implantation of the first conductivity type is conducted to form a source side lightly-doped drain 11, wherein the source side lightly-doped drain 11 is formed in a top area of the well 3 of the second conductivity type and is self-aligned to the first side face of the gate structure, and a second side face of the source side lightly-doped drain 11 makes contact with a first side face of the self-aligned channel region 10. As shown in FIG. 2, the source side lightly-doped drain 11 will be heated to be diffused in the subsequent process, and after being diffused, a bottom surface of the source side lightly-doped drain 11 extends into the well 3 of the second conductivity type.

Figure 3D:
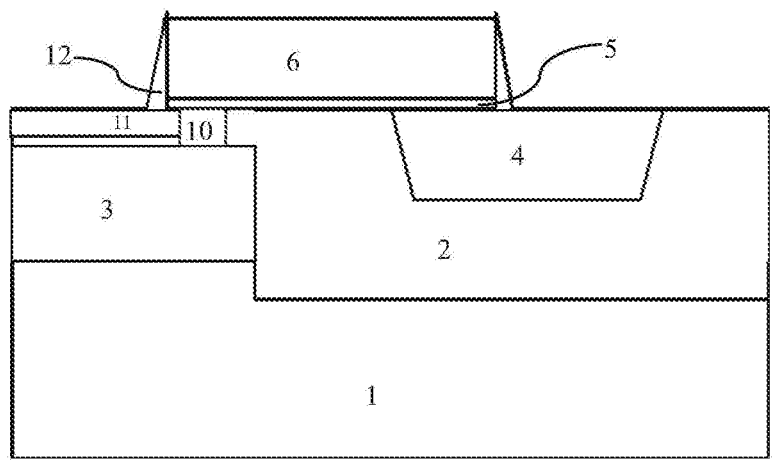

Step 5, as shown in FIG. 3D, spacers 12 are formed on the first side face and the second side face of the gate structure.

Figure 3E:
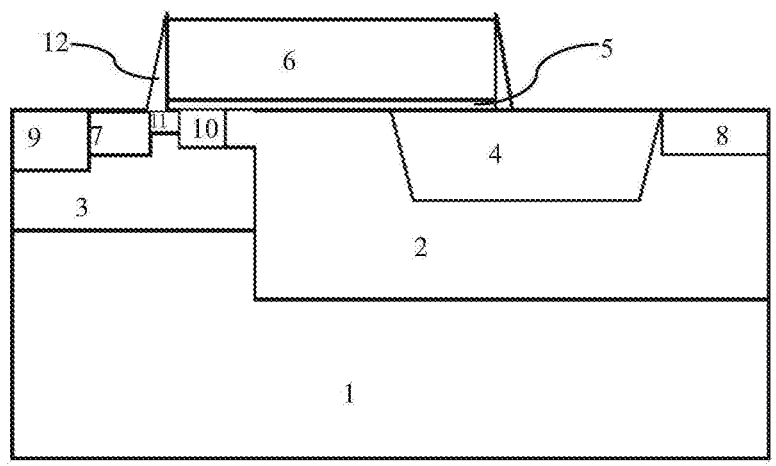

Step 6, as shown in FIG. 3E, heavily-doped source-drain implantation of the first conductivity type is conducted to form a source region 7 and a drain region 8, wherein the source region 7 is formed in the top area of the well 3 of the second conductivity type and is self-aligned to the spacer 12 on the first side face of the gate structure, a bottom surface of the source region 7 extends into the well 3 of the second conductivity type, and a second side face of the source region 7 makes contact with a first side face of the source side lightly-doped drain 11.

The drain region 8 is formed in the drift region 2 outside a second side of the drift region field oxide 4.

The method further comprises the following step:

Step 7, heavily-doped ion implantation of the second conductivity type is conducted to form a channel lead-out region 9 in the top area of the well 3 of the second conductivity type outside a first side face of the source region 7.

In this embodiment, the LDMOS device is an N-type LDMOS device, the first conductivity type is an N type, and the second conductivity type is a P type. Or, in other embodiments, the LDMOS device is a P-type LDMOS device, the first conductivity type is a P type, and the second conductivity type is an N type.

In this embodiment of the invention, the channel region of the LDMOS device is doped in two steps: in the first step, before the gate dielectric layer 5 and the gate conductive layer (polysilicon gate) 6 of the gate structure are formed, the well of the second conductivity type (P-type well) 3 is defined by lithography, and ion implantation and anti-punch-through ion implantation of the P-type well 3 are conducted; the P-type well 3 can remarkably improve the reliability of the device and expand the safe working range of the device; and an anti-punch-through ion implantation region formed by anti-punch-through ion implantation can prevent punch-through when the channel is extremely short. In the second step, after the polysilicon gate is etched, the gate structure of the device is formed by self-aligned ion implantation; this step is conducted at the same time as LDD ion implantation and pocket ion implantation of a low-voltage NMOS, wherein pocket ion implantation is conducted from the source region end along the edge of the polysilicon gate (the edge of the first side face of the polysilicon gate 6), so that a threshold voltage adjustment doped layer (the self-aligned channel region 10) is formed on the surface of the whole channel region (including the P-type well 3 and the anti-punch-through ion implantation region), the length of the channel is determined by the length of the self-aligned channel region (pocket ion implantation), and good interconnection between a source and the channel is ensured by LDD ion implantation. Because pocket ion implantation and LDD ion implantation are both polysilicon gate self-aligned implantation, the channel length on the surface of the channel region is not affected by alignment precision, the characteristic uniformity of the device is greatly improved, and the channel length can be further decreased. In addition, ultralow-energy ion implantation is conducted on low-voltage devices such as LDDs of NMOS transistors, so that the junction depth is small, and punchthrough is prevented while a very small channel length is ensured. Pocket ion implantation and LDD ion implantation are shared by low-voltage NMOSs, so that extra lithography is not needed.

Due to the fact that ion implantation of the P-type well 3 and APT ion implantation adopted in this method to form the LDMOS device are insensitive to the characteristics of the LDMOS device, the electrical characteristics of the LDMOS device will not be affected even if alignment errors are generated by lithography conducted on this layer. The channel length, used as an important characteristic parameter, of the device is defined by self-aligned pocket ion implantation, and lithography errors are avoided, so that the uniformity of the device is improved. Moreover, the channel length of the device can be very small, which fulfills an ultralow specific-on-resistance.

The invention is detailed above with specific embodiments, but these specific embodiments are not intended to limit the invention. Various transformations and improvements can be made by those skilled in this field without deviating from the principle of the invention, and all these transformations and improvements should also fall within the protection scope of the invention.

What is claimed is:

1. A method for manufacturing an LDMOS device, comprising the following steps:

Step 1, forming a doped layer of a first conductivity type on a semiconductor substrate, and forming a drift region by a selected area of the doped layer of the first conductivity type;

forming a well of a second conductivity type through the following sub-steps, defining a formation a area of the well of the second conductivity type by lithography, and conducting ion implantation of the second conductivity type and thermal annealing to form the well of the second conductivity type in a selected area of the doped layer of the first conductivity type, wherein a second side face of the well of the second conductivity type makes contact with a corresponding first aide face oi the drift region; and wherein a top of the well of the second conductivity type is lower than a top surface of the drift region, wherein alter the well of the second conductivity type is formed, the method further comprises the following steps;

conducting, anti-punch-through ion implantation to form an anti-punch-through ion implantation region on a surface area of the well of the second conductivity type; and forming a drift region field oxide in the drift region, wherein a second side face of a gate structure extends onto a surf ace of the drift region field oxide, Step 2, forming the gate structure through the following sub-steps:

Step 21, forming a gate dielectric layer and a gate conductive layer on a surface of the doped layer of the first conductivity type; and Step 22, defining a formation area of the gate structure by lithography, and sequentially etching the gate conductive layer and the gate dielectric layer to form the gate structure, wherein the gate structure has a first side face and the second side face which are defined by lithography;

Step 3, forming a doped self-aligned channel region of the second conductivity type on the surface of the doped layer of the first conductivity type at an inner bottom of the first side face of the gate structure by tilted ion implantation with the first side face of the gate structure as a self-alignment condition, and forming a channel in a surface, covered by the gate structure, of the self-aligned channel region, wherein a length of the channel is defined by self-alignment of the tilted ion implantation and is not affected by lithography; and wherein a bottom surface of the self-aligned channel region extends into the well of the second conductivity type;

Step 4, conducting tightly-doped too implantation of the first conductivity type to form a source side lightly-doped drain, wherein the source side lightly-doped drain is formed in the top area of the well of the second conductivity type and is self-aligned to the first side face of the gate structure, a bottom surface of the source side lightly-doped drain extends into the well of the second conductivity type, and a second side face of the source side lightly-doped drain makes contact with a first side face of the self-aligned channel region;

Step 5, forming spacers on the first side face and the second aide face of the gate structure; and Step 6, conducting heavily-doped source-drain implantation of the first conductivity type to form a source region and a drain region, wherein the source region is formed in the top area of the well of the second conductivity type and is self-aligned to the spacer on the first side face of the gate structure, a bottom surface of the source region extends into the well of the second conductivity type, and a second side face of the source region makes contact with a first side face of the source aide lightly-doped drain; and wherein the drain region is formed in the daft region outside a second slue of the drift region field oxide.

2. The method for manufacturing the LDMOS device according to claim 1, wherein the method further comprises the following step:

Step 7, conducting heavily-doped ion implantation of the second conductivity type to form a channel lead-out region in the top area of the well of the second conductivity type outside a first side face of the source region.

3. The method for manufacturing the LDMOS device according to claim 1, wherein the tilted ion implantation of the self-aligned channel is pocket ion implantation.

4. The method for manufacturing the LDMOS device according to claim 1, wherein the semiconductor substrate is a silicon substrate, and the gate conductive layer is a polysilicon gate;

in Step 1, the doped layer of the first conductivity type is formed by full ion implantation conducted on a surface of the semiconductor substrate; or, the doped layer of the first conductivity type is an epitaxial layer of the first conductivity type formed on the surface of the semiconductor substrate.

5. The method for manufacturing the LDMOS device according to claim 1, wherein the semiconductor substrate is a silicon substrate, and the gate conductive layer is a polysilicon gate;

in Step 1, the doped layer of the first conductivity type is formed by full ion implantation conducted on a surface of the semiconductor substrate; or, the doped layer of the first conductivity type is an epitaxial layer of the first conductivity type formed on the surface of the semiconductor substrate.

6. The method for manufacturing the LDMOS device according to claim 1, wherein the semiconductor substrate is a silicon substrate, and the gate conductive layer is a polysilicon gate;

in Step 1, the doped layer of the first conductivity type is formed by full ion implantation conducted on a surface of the semiconductor substrate; or, the doped layer of the first conductivity type is an epitaxial layer of the first conductivity type formed on the surface of the semiconductor substrate.

* * * * *

UNITED STATES PATENT AND TRADEMARK OFFICE
CERTIFICATE OF CORRECTION

PATENT NO. : 11,264,497 B2
APPLICATION NO. : 16/657096
DATED : March 1, 2022
INVENTOR(S) : Wensheng Qian It is certified that error appears in the above-identified patent and that said Letters Patent is hereby corrected as shown below:

In the Claims

Column 11, Line 19, Claim 1 replace the "," with ":";

Column 11, Line 20, Claim 1 delete "a" after "formation";

Column 11, Line 28, Claim 1 replace "aide" with "side";

Column 11, Line 28, Claim 1 replace "oi" with "of";

Column 11, Line 30, Claim 1 replace the "," with ";";

Column 11, Line 31, Claim 1 replace "alter" with "after";

Column 11, Line 33, Claim 1 replace the ";" with ":";

Column 11, Line 34, Claim 1 delete the "," after the word "conducting";

Column 11, Line 40, Claim 1 replace the "," with ";";

Column 11, Line 65, Claim 1 replace "too" with "ion";

Column 12, Line 10, Claim 1 replace "aide" with "side";

Column 12, Line 21, Claim 1 replace "aide" with "side";

Column 12, Line 22, Claim 1 replace "daft" with "drift"; and

Column 12, Line 23, Claim 1 replace "slue" with "side".

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*